US009391266B1

(12) United States Patent
Hu et al.

(10) Patent No.: US 9,391,266 B1
(45) Date of Patent: Jul. 12, 2016

(54) PERPENDICULAR MAGNETIC ANISOTROPY BCC MULTILAYERS

(71) Applicant: International Business Machines Corporation, Armonk, NY (US)

(72) Inventors: Guohan Hu, Yorktown Heights, NY (US); Daniel C. Worledge, Cortlandt Manor, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/669,337

(22) Filed: Mar. 26, 2015

(51) Int. Cl.
*H01L 43/10* (2006.01)
*H01L 43/02* (2006.01)
*H01L 43/08* (2006.01)
*H01L 43/12* (2006.01)
*G11C 11/16* (2006.01)

(52) U.S. Cl.
CPC ............. *H01L 43/10* (2013.01); *G11C 11/161* (2013.01); *H01L 43/02* (2013.01); *H01L 43/08* (2013.01); *H01L 43/12* (2013.01)

(58) Field of Classification Search
CPC ......... H01L 43/10; H01L 43/08; H01L 43/12; H01L 43/02; G11C 11/161
See application file for complete search history.

(56) References Cited

U.S. PATENT DOCUMENTS

| 4,208,254 | A  | * | 6/1980  | Mitsumoto ............ C25D 3/562 204/DIG. 9 |
| 5,001,018 | A  | * | 3/1991  | Takada .................. B82Y 25/00 428/611 |
| 5,768,183 | A  |   | 6/1998  | Zhu et al. |
| 6,153,020 | A  | * | 11/2000 | Chen ....................... C22C 19/07 148/120 |
| 6,855,240 | B2 | * | 2/2005  | Cooper ................... H01F 41/26 205/103 |
| 8,111,488 | B2 |   | 2/2012  | Fuji et al. |
| 8,508,006 | B2 |   | 8/2013  | Jan et al. |
| 8,836,000 | B1 |   | 9/2014  | Lin |
| 2004/0185307 | A1 | * | 9/2004 | Oikawa .................... G11B 5/66 428/827 |
| 2007/0045102 | A1 | * | 3/2007 | Lee ....................... C23C 14/352 204/192.2 |
| 2010/0073827 | A1 | * | 3/2010 | Zhao ..................... B82Y 10/00 360/324.2 |
| 2012/0267733 | A1 |   | 10/2012 | Hu et al. |
| 2014/0084398 | A1 |   | 3/2014  | Oguz et al. |
| 2014/0306303 | A1 |   | 10/2014 | Moriyama et al. |

OTHER PUBLICATIONS

Guohan Hu, et al.; "Perpendicular Magnetic Anisotropy BCC Multilayers"; U.S. Appl. No. 14/744,137, filed Jun. 19, 2015.
List of IBM Patents or Patent Applications Treated as Related—Date Filed: Aug. 7, 2015; 1 page.
Carbucicchio, M., et al.; "Effects of deposition Temperature and Elemental Layer Thickness on the Properties of Fe/Co Multilayers Grown by Molecular Beam Epitaxy"; Journal of Physics D: Applied Physics; vol. 43, No. 40; p. 1-11; 2010.

(Continued)

*Primary Examiner* — William Coleman
(74) *Attorney, Agent, or Firm* — Cantor Colburn LLP; Vazken Alexanian

(57) ABSTRACT

A magnetic material includes a cobalt layer between opposing iron layers. The iron layers include iron and are body-centered cubic (BCC), the cobalt layer comprises cobalt and is BCC or amorphous, and the magnetic material has a perpendicular magnetic anisotropy (PMA).

3 Claims, 3 Drawing Sheets

(56) References Cited

OTHER PUBLICATIONS

Kazakova, O., et al.; "Interplay Between Shape and Magnetocrystalline Anistropies in Patterned bcc Fe/Co(001) Multilayers"; Physical Review; B 69, p. 094408-1-094408-9; 2004.

Park, Ji-Ho, et al; "Perpendicular Magnetic Tunnel Junctions with CoFe/Pd Mulitlayer Electrodes and an MgO Barrier"; IEEE Transactions on Magnetics, vol. 45, No. 10; p. 3476-3479; Oct. 2009.

* cited by examiner

PERPENDICULAR MAGNETIC ANISOTROPY BCC MULTILAYERS

BACKGROUND

The present disclosure generally relates to magnetic materials, and more specifically to magnetic multilayer materials.

A spin torque magnetic random access memory (MRAM) is a type of solid state, non-volatile memory that uses tunneling magnetoresistance (TMR or MR) to store information. MRAM includes an electrically connected array of magnetoresistive memory elements, referred to as magnetic tunnel junctions (MTJs). Each MTJ includes a free layer and fixed/reference layer that each include a magnetic material layer. The free and fixed/reference layers are separated by a non-magnetic insulating tunnel barrier. The free layer and the reference layer are magnetically de-coupled by the tunnel barrier. The free layer has a variable magnetization direction, and the reference layer has an invariable magnetization direction.

An MTJ stores information by switching the magnetization state of the free layer. When the free layer's magnetization direction is parallel to the reference layer's magnetization direction, the MTJ is in a low resistance state. Conversely, when the free layer's magnetization direction is antiparallel to the reference layer's magnetization direction, the MTJ is in a high resistance state. The difference in resistance of the MTJ may be used to indicate a logical '1' or '0', thereby storing a bit of information. The TMR of an MTJ determines the difference in resistance between the high and low resistance states. A relatively high difference between the high and low resistance states facilitates read operations in the MRAM.

The magnetization direction of the free layer may be changed by a spin torque switched (STT) write method, in which a write current is applied in a direction perpendicular to the film plane of the magnetic films forming the MTJ. The write current has a tunneling magnetoresistive effect to change (or reverse) the free layer's magnetization direction. During STT magnetization reversal, the write current for magnetization reversal is determined by the current density. As the surface area of the the MTJ becomes smaller, the write current for reversing the free layer's magnetization becomes smaller. Therefore, if writing is performed with fixed current density, the necessary write current becomes smaller as the MTJ size becomes smaller.

Compared to MTJs with in-plane magnetic anisotropy, layers with perpendicular magnetic anisotropy (PMA) can lower the necessary write current density. Thus, PMA lowers the total write current used.

SUMMARY

In one embodiment of the present disclosure, a magnetic material includes a cobalt layer between opposing iron layers. The iron layers comprise iron and are body-centered cubic (BCC), the cobalt layer comprises cobalt and is BCC or amorphous, and the magnetic material has a perpendicular magnetic anisotropy (PMA).

In another embodiment, a magnetic material includes alternating layers of an iron layer and a cobalt layer. The iron layer comprises iron and is BCC, the cobalt layer comprises cobalt and is BCC or amorphous, and the iron and cobalt layers each have thickness of about 2 to about 10 angstroms (Å).

Yet, in another embodiment, a method of making a magnetic material includes forming a cobalt layer on a first iron layer and forming a second iron layer on the cobalt layer. The first and second iron layers comprise iron and are BCC, the cobalt layer comprises cobalt and is BCC or amorphous, and the magnetic material has a PMA.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1A:
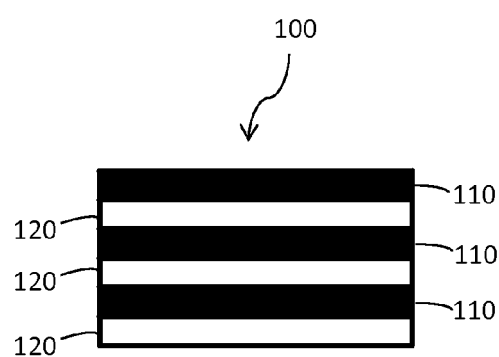
FIG. 1A is a cross-sectional view of a multilayer magnetic material according to an exemplary embodiment.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

As used herein, the terms "atomic percent," "atomic %" and "at. %" mean the percentage of atoms of a pure substance divided by the total number of atoms of a compound or composition, multiplied by 100.

As used herein, the terms "body-centered cubic" and "BCC" mean the cubic crystal lattice has one central lattice point and eight corner lattice points in each unit cell. As used herein, the terms "face-centered cubic" and "FCC" mean the cubic crystal lattice has lattice points on the central faces of the cube and eight corner lattice points in each unit cell. The crystal lattice structure is determined by transmission electron microscopy (TEM) to analyze the electron diffraction pattern in reciprocal space. The periodic structure of a crystalline solid (whether BCC or FCC) acts as a diffraction grating, scattering the electrons in a predictable manner. Working backwards from the observed diffraction pattern, the crystal lattice structure can be determined.

As used herein, the term "amorphous" means a non-crystalline solid. Amorphous materials can have small crystalline areas. In amorphous materials, at least 95% of the material is amorphous.

As used herein, the term "magnetic anisotropy" means the magnetization prefers to orient in a particular direction.

As used herein, the terms "perpendicular magnetic anisotropy" and "PMA" mean the magnetization prefers to orient perpendicular to the xy-plane. PMA can be determined by measuring magnetic hysteresis loops in both in-plane and out-of-plane directions.

As used herein, the terms "magnetoresistance" or "MR" refers to a magnetic tunnel junction's property of changing the value of its electrical resistance in the presence of an external magnetic field. MR can be measured by applying a magnetic field in one direction and measuring the resistance, and then applying a magnetic field in a different direction and measuring the resistance.

Spin torque MRAM has disadvantages that must be overcome before it can be manufactured. First, the MR must be increased to enable smaller bit reading. For high MR with magnesium oxide (MgO) tunnel barriers, the following features are optimal: 1) the material should have a two-dimensional (2D) interface with MgO that has a square lattice net; 2) the material should be a sufficient lattice match to MgO; and 3) the material at the interface should have a spin polarization of the $\Delta_1$ bands. Although BCC Fe-based alloys (e.g., CoFe or CoFeB) can be used, making BCC materials exhibit PMA is challenging.

Thin film magnetization generally lies in the plane of the film (in-plane magnetic anisotropy) in order to minimize the magnetostatic energy. However, a PMA axis is necessary for efficient spin torque switching. Multilayer systems such as Co|Ni, Co|Pd, and Co|Pt have strong PMA when they have sufficient face-centered cubic (FCC) (111) crystal orientation. However, the FCC structure does not provide sufficiently high MR with MgO tunnel barriers that need BCC structure. It is challenging to develop magnetic materials systems that simultaneously provide high MR and large PMA.

The present disclosure solves the above problems by providing a multilayer magnetic material that has both high MR and large PMA. The magnetic materials include multilayers of BCC materials and amorphous materials, in any combination. For example, the multilayer magnetic materials include repeating BCC|BCC layers, BCC|amorphous layers, amorphous|BCC layers, or any combination thereof. The PMA arises from the anisotropy at each interface, or potentially from strain.

Referring to FIG. 1A, a cross-sectional view of a multilayer magnetic material 100 according to an exemplary embodiment is shown. The multilayer magnetic material 100 includes repeating (or alternating) iron layers 110 and cobalt layers 120. Both the iron and cobalt layers 110 and 120 are magnetic. Iron layer 110 includes iron and is BCC. Iron layer 110 can include an iron alloy. Non-limiting examples of suitable materials for the iron layer include iron, cobalt, boron, aluminum, nickel, silicon, oxygen, carbon or any combination thereof. Iron layer 110 includes iron in an amount of at least 50 at. %. In some embodiments, iron is present in an amount of at least 50, 55, 60, 65, 70, 75, 80, 85, 90, or 95 at. %. The multilayer magnetic material has PMA.

Cobalt layer 120 includes cobalt and is either BCC or amorphous. Cobalt layer 120 includes a BCC or amorphous cobalt material. The cobalt layer 120 can include a cobalt alloy. Non-limiting examples of suitable materials for the cobalt layer 120 include cobalt, zinc, beryllium, vanadium, boron, magnesium, aluminum, silicon, oxygen, carbon, or any combination thereof. For example, non-limiting examples of BCC cobalt alloys include cobalt zinc, cobalt beryllium, and cobalt vanadium. Non-limiting examples of amorphous cobalt alloys include cobalt boron, cobalt magnesium, cobalt aluminum, cobalt silicon, cobalt beryllium, and cobalt carbon. Cobalt layer 120 includes cobalt in an amount of at least 30 at. %. In some embodiments, cobalt is present in an amount of at least 30, 35, 40, 45, 50, 55, 60, 65, 70, 75, 80, 85, 90, or 95 at. %.

The iron and cobalt layers 110 and 120 are thin to maximize the interface anisotropy. The thickness of each of the iron and cobalt layers 110 and 120 is between about 2 and about 10 Angstroms (Å). The thickness of each of the iron and cobalt layers 110 and 120 can be the same or different. Each iron and cobalt layer 110 and 120 has a thickness about or in any range between about 2, 3, 4, 5, 6, 7, 8, 9, and 10 Å.

The multilayer material includes any number of alternating iron and cobalt layers 110 and 120. The multilayer material includes at least three layers, for example a cobalt layer 120 sandwiched between two iron layers 110 (Fe|Co|Fe). The multilayer material includes at least 3 layers. The multilayer magnetic material includes any number of repeats of iron and cobalt layers 110 and 120, with a single repeat being signified by Fe|Co or Co|Fe. For example, 1.5 repeats are signified by Fe|Co|Fe, and 3 repeats are signified by Fe|Co|Fe|Co|Fe|Co. Anywhere from about 3 to 100 repeats are used.

Figure 1B:
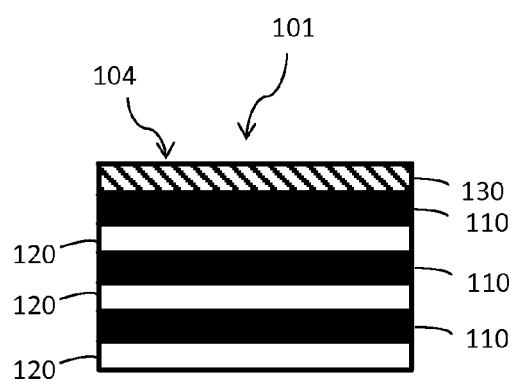
FIG. 1B is a cross-sectional view the multilayer magnetic material of FIG. 1A with a magnesium oxide tunnel barrier layer on a first surface according to an exemplary embodiment.

FIG. 1B is a cross-sectional view the multilayer magnetic material 101 of FIG. 1A with a tunnel barrier layer 130 on a first surface 104 according to an exemplary embodiment. As shown, the tunnel barrier layer 130 is in contact with the iron layer 110. However, the tunnel barrier layer 130 can contact the cobalt layer 120 in other embodiments (not shown). When the multilayer magnetic material 101 is incorporated into a MTJ, it is advantageous to have the iron layer 110 contact the tunnel barrier layer 130 because the polarization of the delta$_1$ bands are higher for Fe. Either the cobalt layer 120 or the iron layer 110 can contact the tunnel barrier layer 130.

The tunnel barrier layer 130 adds anisotropy to the multilayer structure. The tunnel barrier layer 130 is a non-magnetic, insulating material. A non-limiting example of a suitable material for the tunnel barrier layer 130 includes magnesium oxide (MgO). The tunnel barrier layer 130 is formed by radiofrequency (RF) sputtering in some embodiments. Alternatively, the tunnel barrier layer 130 is formed by oxidation (e.g., natural or radical oxidation) of a magnesium (Mg) layer. After oxidation, the MgO layer may then be capped with a second layer of Mg. The second layer of Mg may have a thickness of about 5 Å or less in some embodiments. The tunnel barrier layer 130 total thickness is not intended to be limited. The tunnel barrier layer can have a thickness, for example, in a range of about 5 to about 30 Å. The MgO tunnel barrier can have a rock salt crystalline structure.

Figure 1C:
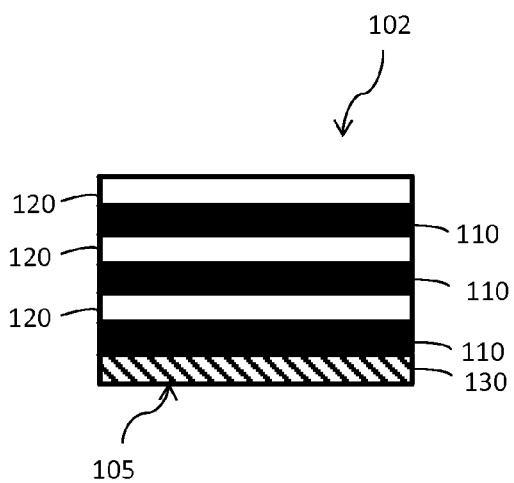
FIG. 1C is a cross-sectional view of the multilayer magnetic material of FIG. 1A with a tunnel barrier layer on a second surface according to an exemplary embodiment.
Figure 1D:
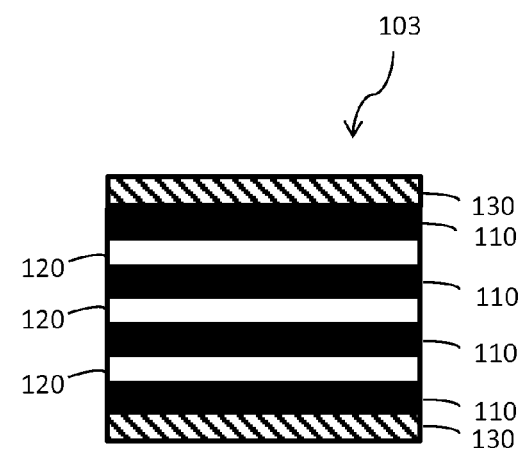
FIG. 1D is a cross-sectional view of the multilayer magnetic material of FIG. 1A with a tunnel barrier layer on two surfaces according to an exemplary embodiment.

FIG. 1C is a cross-sectional view of the multilayer magnetic material 103 of FIG. 1A with a tunnel barrier layer 130 on a second surface 102 according to an exemplary embodiment. FIG. 1D is a cross-sectional view of the multilayer magnetic material 103 of FIG. 1A with a tunnel barrier layer 130 on both the first and second surfaces 104 and 105 according to another exemplary embodiment. The thickness of the tunnel barrier layer 130 on first and second surfaces 104 and 105 can be the same or different.

Figures 2A, 2B:
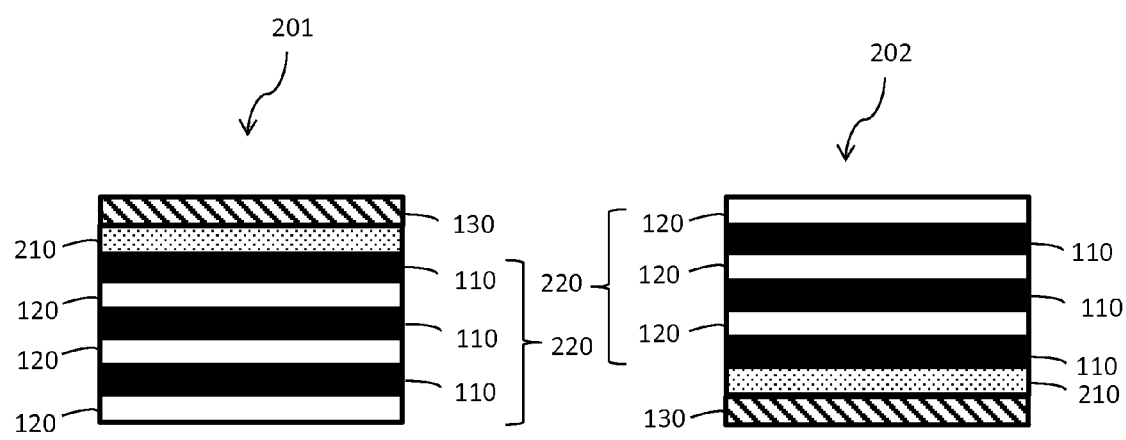
FIG. 2A is a cross-sectional view of the multilayer magnetic material of FIG. 1B with a dusting layer disposed between the tunnel barrier layer and the multilayer material according to an exemplary embodiment.
FIG. 2B is a cross-sectional view of the multilayer magnetic material of FIG. 1C with a dusting layer disposed between the tunnel barrier layer and the multilayer material according to an exemplary embodiment.

FIG. 2A is a cross-sectional view of the multilayer magnetic material 201 of FIG. 1B with a dusting layer 210 disposed between the tunnel barrier layer 130 and the multilayer structure portion 220 according to an exemplary embodiment. FIG. 2B is a cross-sectional view of the multilayer magnetic material 202 of FIG. 1C with a dusting layer 210 disposed between the tunnel barrier layer 130 and the multilayer structure portion 220 according to another exemplary embodiment. The dusting layer 210 can include iron, cobalt, boron, or any combination thereof. When the dusting layer 210 includes iron, iron is present in an amount of at least about 20 at. %.

The dusting layer 210 can be inserted between the multilayer structure portion 220 and the tunnel barrier layer 130 to further increase MR. The dusting layer 210 may have smaller PMA but higher spin polarization than the multilayer structure portion 220. A suitable dusting layer 210 can be Fe-rich CoFeB or CoFe, e.g., $Co_{20}Fe_{60}B_{20}$.

The thickness of the dusting layer 210 is not intended to be limited and can be any suitable thickness. The dusting layer 210 can have a thickness in a range from about 5 to about 20 Å thick. The dusting layer 210 can have a thickness about or in any range from about 5, 10, 15, 20, or 25 Å.

Full MTJs can be formed by using two multilayer portions as described above, one on either side of the tunnel barrier layer. Dusting layers may be used on both tunnel barrier layer interfaces. Alternatively, the multilayer portions may be used on only one side of the tunnel barrier layer 130, and a different magnetic material can be used on the other side.

Figures 3A, 3B, 3C:
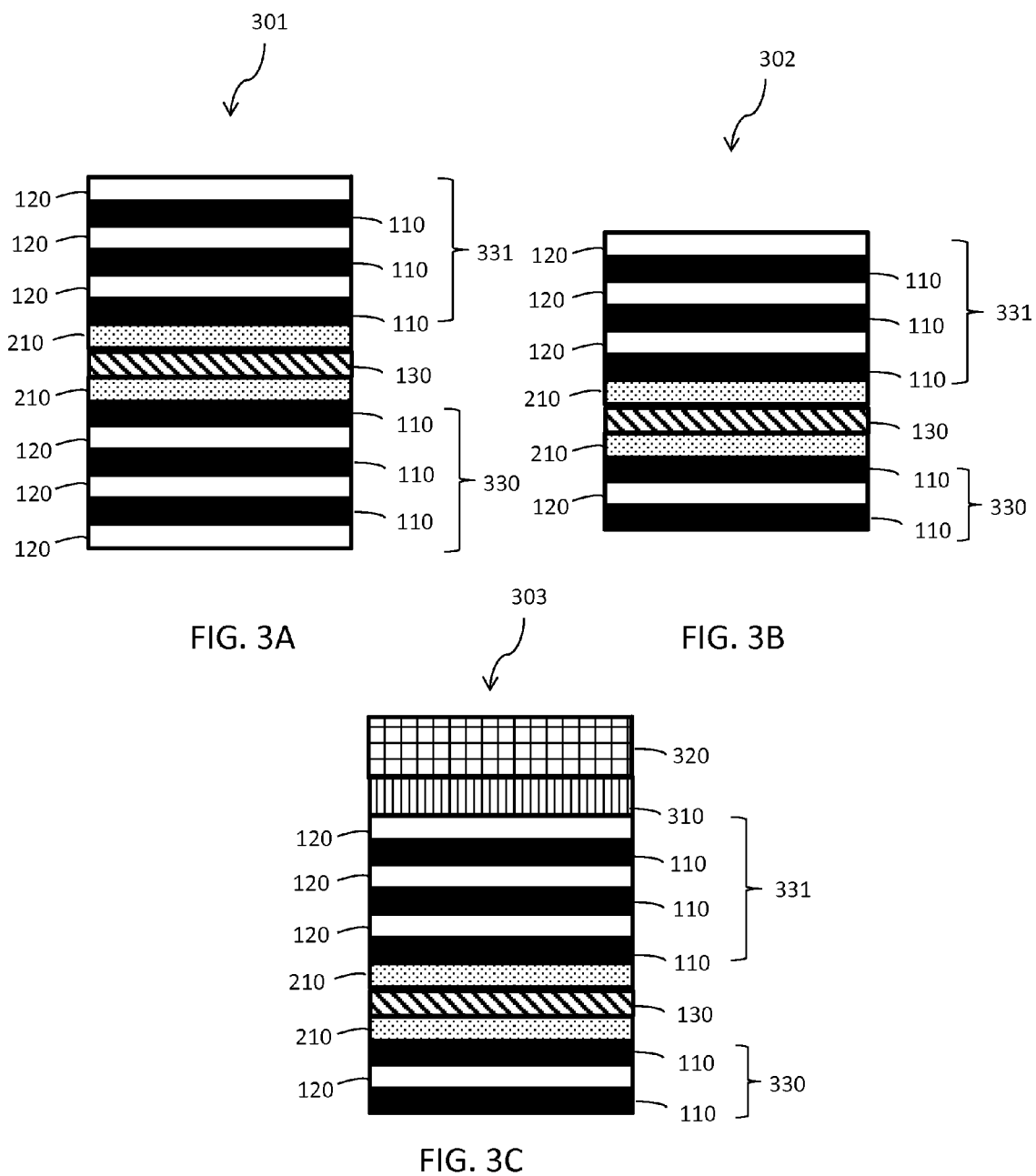
FIG. 3A is a cross-sectional view of a tunnel junction including the multilayer magnetic material as a free layer and as a reference layer according to an exemplary embodiment.
FIG. 3B is a cross-sectional view of a tunnel junction including the multilayer magnetic material as a free layer and as a reference layer, where the free layer is thinner than the reference layer according to an exemplary embodiment.
FIG. 3C is a cross-sectional view of the tunnel junction of FIG. 3B including a spacer layer and a magnetic layer according to an exemplary embodiment.

FIG. 3A is a cross-sectional view of a MTJ 301 including the multilayer magnetic material as a free layer 330 and a reference layer 331 according to an exemplary embodiment. Optionally, a dusting layer 210 is formed on top of the multilayer magnetic material forming the free layer 330. The free layer 130 has a variable magnetization direction. A tunnel barrier layer 130 is formed on top of the optional dusting layer 210. Alternatively, the tunnel barrier layer 130 is formed directly on the multilayer structure forming the free layer 330. Optionally, another dusting layer 210 is formed on the tunnel barrier layer 210. When more than one dusting layer is used, the dusting layers can be the same or different (e.g., different thicknesses and/or materials). The multilayer magnetic material is then disposed as a reference layer 331 on top of the dusting layer 210 or the tunnel barrier layer 130. The reference layer 331 has an invariable magnetization direction. The reference layer 331 can include the same number or a different number of iron layers 110 and cobalt layers 120. The reference layer 331 also can include different thicknesses of iron layers 110 and cobalt layers 120. The free layer 330 and the reference layer 331 have PMA and are magnetically coupled through the tunnel barrier layer 130.

FIG. 3B is a cross-sectional view of a MTJ 302 according to an exemplary embodiment. As shown, the reference layer 331 is thicker than the free layer 330. The multilayer magnetic material forms both the free layer 330 and the reference layer 331. In other embodiments, the reference layer 331 is has the same, similar, or thinner thickness compared to the free layer 330 (not shown). Like in FIG. 3A, an optional dusting layer 210 is formed on the multilayer magnetic material forming the free layer 330. A tunnel barrier layer 130 is formed on the optional dusting layer 210. Another optional dusting layer 210 is formed on the tunnel barrier layer 130. The multilayer magnetic material forming the reference layer 331 is formed on the dusting layer 210 or the tunnel barrier layer 130. The free layer 330 and the reference layer 331 have PMA.

FIG. 3C is a cross-sectional view of a MTJ 303 of FIG. 3B including a spacer layer 310 and a magnetic layer 320 according to an exemplary embodiment. An optional dusting layer 210 is formed on the multilayer magnetic material forming the free layer 330. A tunnel barrier layer 130 is formed on the optional dusting layer 210. Another optional dusting layer 210 is formed on the tunnel barrier layer 130. The multilayer magnetic material forming the reference layer 331 is formed on the optional dusting layer 210 or the tunnel barrier layer 130. The spacer layer 310 is formed on the multilayer magnetic material forming the reference layer 331. The spacer layer 310 is any non-magnetic material. The magnetic layer 320 is formed on the spacer layer 320 and can include any magnetic material. The free layer 330 and the reference layer 331 have PMA The spacer layer 310 includes, for example, chromium, ruthenium, titanium nitride, titanium, vanadium, tantalum, tantalum nitride, aluminum, magnesium, oxides such as MgO, or any combination thereof. The thickness of the spacer layer 310 is not intended to be limited. The spacer layer 310 can have a thickness, for example of less than 10, less than 5, less than 3, less than 2, or less than 1 Å.

The magnetic layer 320 includes a magnetic material. Non-limiting examples of suitable magnetic materials include cobalt/platinum multilayers, cobalt/palladium multilayers, or any combination thereof. The thickness of the magnetic layer 320 is not intended to be limited. The magnetic layer can have a thickness of about 20-200 Å.

Any of the MTJs 301, 302, or 303 can be grown in any order. For example, the MTJs can be grown with the free layer 330 on top of the reference layer 331 (not shown). The multilayer magnetic structure can be used as both the free layer 330 and the reference layer 331 as shown in MTJs 301, 302, and 303. The multilayer magnetic material also can be used as just one of the free layer 330 or the reference layer 331.

It should be appreciated that the exemplary embodiments shown in FIGS. 1A-D, 2A-B, and 3A-C and discussed above are shown for illustrative purposes only. It is thus contemplated that other suitable multilayer magnetic materials and tunnel junctions may be formed.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A magnetic material, comprising:
   alternating layers of an iron layer and a cobalt layer;
   a magnesium oxide layer arranged on the iron layer on a surface of the magnetic material; and
   a dusting layer between the iron layer and the magnesium layer;
   wherein the iron layer comprises iron and is BCC, the cobalt layer comprises cobalt and is BCC or amorphous, and the iron and cobalt layers each have thickness of about 2 to about 10 angstroms (Å).

2. The magnetic material of claim 1, wherein the magnetic material comprises at least three layers.

3. A magnetic material, comprising:
   alternating layers of an iron layer and a cobalt layer;
   a magnesium oxide layer arranged on the iron layer on a surface of the magnetic material; and
   a dusting layer between the iron layer and the magnesium oxide layer;
   wherein the iron layer comprises iron and is BCC, the cobalt layer comprises cobalt and is BCC or amorphous, and the iron and cobalt layers each have thickness of about 2 to about 10 angstroms (Å), and the dusting layer comprises iron.

* * * * *